(12) United States Patent
Kweon

(10) Patent No.: US 6,946,340 B2
(45) Date of Patent: Sep. 20, 2005

(54) METHOD OF FABRICATING FERROELECTRIC MEMORY DEVICE WITH PHOTORESIST AND CAPPING LAYER

(75) Inventor: Soon-Yong Kweon, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/136,429

(22) Filed: May 2, 2002

(65) Prior Publication Data

US 2002/0168817 A1 Nov. 14, 2002

(30) Foreign Application Priority Data

May 3, 2001 (KR) ........................................ 2001-24069

(51) Int. Cl.[7] ........................................ H01L 21/8242
(52) U.S. Cl. ................................................ 438/240
(58) Field of Search ................................ 438/197, 210, 438/238, 239, 240, 250, 253–256, 396–399, 200, 244, 287; 257/298, 303, 304, 306, 310, 295

(56) References Cited

U.S. PATENT DOCUMENTS

| | | | |
|---|---|---|---|
| 4,186,423 A | 1/1980 | Yoshida et al. | |
| 5,668,040 A | 9/1997 | Byun | |
| 5,723,395 A | 3/1998 | Suzuki et al. | |
| 5,820,664 A | 10/1998 | Gardiner et al. | |
| 5,833,714 A | 11/1998 | Loeb | |
| 5,905,278 A * | 5/1999 | Nakabayashi | 257/296 |
| 6,011,284 A | 1/2000 | Katori et al. | |
| 6,043,561 A | 3/2000 | Katori et al. | |
| 6,096,391 A | 8/2000 | Muffoletto et al. | |
| 6,110,529 A | 8/2000 | Gardiner et al. | |
| 6,171,970 B1 * | 1/2001 | Xing et al. | 438/706 |
| 6,284,655 B1 * | 9/2001 | Marsh | 438/681 |
| 6,376,325 B1 * | 4/2002 | Koo | 438/396 |
| 6,407,422 B1 * | 6/2002 | Asano et al. | 257/306 |
| 6,462,931 B1 * | 10/2002 | Tang et al. | 361/305 |
| 6,645,779 B2 * | 11/2003 | Hong | 438/3 |

FOREIGN PATENT DOCUMENTS

| | | | | |
|---|---|---|---|---|
| KR | 1998-034205 | | 8/1998 | |
| KR | 19980304205 | * | 8/1998 | ......... H01L/21/762 |
| KR | 1019990200753 | | 3/1999 | |
| KR | 1019990200753 | * | 11/1999 | ......... H01L/21/762 |

* cited by examiner

Primary Examiner—Craig A. Thompson
Assistant Examiner—Jennifer Dolan
(74) Attorney, Agent, or Firm—Pillsbury Winthrop Shaw Pittman LLP

(57) ABSTRACT

A method for fabricating a high-density ferroelectric memory device is disclosed in which a plug can be heat-treated at a high temperature. The method includes the following. Forming an interlayer dielectric film on a semiconductor substrate after forming a transistor on the semiconductor substrate. The interlayer dielectric film is selectively etched to form a contact hole. A plug and a barrier film are buried into the contact hole. A conductive film is formed on the interlayer dielectric film including the barrier film. The conductive film is selectively etched to make both ends of the conductive film inclined so as to form a capping layer for capping the barrier film. There are sequentially formed a lower electrode, a ferroelectric thin film and an upper electrode upon the interlayer dielectric film (which includes the capping layer).

14 Claims, 3 Drawing Sheets

PRIOR ART

METHOD OF FABRICATING FERROELECTRIC MEMORY DEVICE WITH PHOTORESIST AND CAPPING LAYER

BACKGROUND

The inventions described and/or claimed herein generally relate to fabricating a memory device. More specifically, they relate to methods of fabricating a high-density ferroelectric memory device in which a plug is prevented from being oxidized during a high temperature heat treatment.

Efforts have been made to develop a large capacity memory device in which a ferroelectric thin film is used in a ferroelectric capacitor so that the refresh limitation of the DRAM (dynamic random access memory) can be overcome.

Such a ferroelectric random access memory ("FeRAM") that utilizes the ferroelectric thin film is a kind of nonvolatile memory device. This FeRAM retains previously stored information even when power is not applied to the device. Its operating speed is comparable to that of DRAM. Accordingly, FeRAM is getting significant attention as a potential next generation memory device.

The charge storing material for this FeRAM device, is a ferroelectric thin film such as $SrBi_2Ta_2O_9$ ("SBT") and $Pb(Zr_xTi_{1-x})O_3$ ("PZT"). The ferroelectric thin film has two stable remnant polarizations (Pr). It is formed into a thin film to use it in the nonvolatile memory.

A nonvolatile memory device which uses the ferroelectric thin film, takes advantage of a hysteresis characteristic to store either a '1' or a '0' in accordance with a remnant polarization which is present when the electric field is removed after inputting the signals by adjusting the polarization direction in the direction of the imposed electric field.

In the FeRAM device, in the case where a ferroelectric thin film such as $SrBi_2(Ta_{2-x}Nb_x)_2O_9$ ("SBTN") or $(Bi_{4-x}La_x)Ti_3O_{12}$ ("BLT") having a perovskite structure is used for the ferroelectric capacitor, there are formed upper and lower electrodes which are generally made of Pt, Ir, Ru, $IrO_x$, $RuO_x$, Pt-alloy or the like.

When forming the lower electrode of a capacitor by using such a conductive metal, a capacitor contact plug is first formed for a connection to the transistor which has been formed on the semiconductor substrate by forming a word line, a bit line and the like.

Then titanium silicide/titanium nitride (Ti-silicide/TiN) as a barrier metal is used, so that the adhesion between the capacitor contact plug and the lower electrode can be improved, the ion diffusion can be prevented, and the contact resistance can also be improved.

The titanium silicide/titanium nitride (Ti-silicide/TiN) layer acts to prevent the diffusion and to improve the contact resistance for the lower electrode. That is, the titanium silicide (Ti-silicide) makes the ohmic contact between the lower electrode and the plug and the titanium nitride (TiN) layer prevents the interdiffusion between the lower electrode and the plug at high temperature processes during the fabrication of the capacitor.

However, during the thermal process which is carried out at a high temperature of above 700° C. for the crystallization of the ferroelectric film, there is the problem that the ferroelectric capacitor loses its ferroelectric properties due to the oxidation of titanium silicide/titanium nitride.

Recently, in order to fabricate the FeRAM, the lowering of the crystallization heat treatment temperature is being attempted, and a plug forming process in which the plug can withstand high temperature heat treatment is being developed.

The conventional high-density FeRAM fabricating process will be described below.

FIG. 1 (PRIOR ART) illustrates the conventional FeRAM fabricating method. A dopant junction layer 13 is formed on a semiconductor substrate 11 on which a field oxide layer 12 has been formed. Then an interlayer dielectric film (ILD) 14 is formed on the semiconductor substrate 11.

Then photoresist is spread on the interlayer dielectric film 14. Patterning is carried out by exposing and developing. The patterned photoresist film is utilized as a mask to etch the interlayer dielectric film. Thus a contact hole is formed, and part of the underlying dopant junction layer 13 is exposed. Then the patterned photoresist film is removed.

Then an n-type doped polysilicon layer ("n-polysilicon") is formed on the entire surface including the contact hole, and then, a recessing is carried out through an etch-back, thereby forming an n-polysilicon plug 15 which is buried into the contact hole.

Then Ti is deposited on the entire surface, and then, a rapid thermal nitration (RTN) is carried out at 700° C.~900° C., so that reactions can be induced between the Ti atoms and the Si atoms of the n-polysilicon plug 15. Thus a Ti-silicide film 16 is formed on the n-polysilicon plug 15.

Under this condition, the Ti silicide film 16 forms an ohmic contact between the n-polysilicon plug 15 and the lower electrode. Then a TiN layer 17 is formed on the titanium silicide layer 16, and then, a chemical-mechanical polishing (CMP) or an etch-back is carried out until the surface of the interlayer dielectric film 14 is exposed, thereby forming a barrier metal layer. The barrier metal layer has a stacked structure of the Ti silicide/TiN layers 16 and 17. Under this condition, the TiN layer 17 serves as an interdiffusion-preventing layer between the polysilicon plug and the lower electrode.

Then a $TiO_x$ layer is formed on the interlayer dielectric film 14 including the TiN layer 17, and the $TiO_x$ layer is selectively etched to expose the TiN layer 17. Then a $TiO_x$-adhesive layer 18 is formed on the relevant portions of the interlayer dielectric film 14.

Then, Pt and SBT are sequentially stacked on the $TiO_2$-adhesive layer 18, and then, the Pt and SBT are selectively etched to form a stacked structure of a lower electrode 19 and a ferroelectric film 20. Then Pt is deposited on the ferroelectric film to form an upper electrode 21.

Thus in the above-described example of the conventional technique, the stacking is carried out in the sequence of n-polysilicon/Ti silicide/TiN/Pt. In this stacked structure, when a heat treatment is carried out later for the crystallization of the ferroelectric film, the Pt layer is inadequate for preventing the oxygen diffusion, and therefore, the heat treatment cannot be carried out above a temperature of 500° C.

Recently, in order to improve the oxygen diffusion prevention insufficiency at the elevated temperature heat treatment, research is being carried out to enable the use of $IrO_2/Ir$ instead of Pt.

FIG. 2 (PRIOR ART) illustrates another example of the conventional techniques. Here, $IrO_2/Ir$ is used for forming the lower electrode of the FeRAM capacitor. The process steps up to the formation of the stacked plug of TiN/Ti silicide/n-polysilicon films 17/16/15 are same as those of FIG. 1 (PRIOR ART). However, the adhesive layer consists of an IrO$_x$ layer 22, while the lower electrode consists of IrO$_x$/Ir layers 24 and 23. Further, the ferroelectric film 20 is made of SBT, while Pt is used for the upper electrode 21.

In this second example of the conventional techniques, however, the lower electrode consists of a stacked structure of IrO$_x$/Ir layers 24 and 23, and therefore, the thickness of the lower electrode to be etched is increased. Further, when opening the iridium oxide layer 22, the titanium nitride layer 17 that lies upon the plug is liable to be damaged.

Meanwhile, in the case where SBT, PZT or the like is used for the ferroelectric film 20, the high temperature crystallization heat treatment has to be necessarily carried out, and therefore, an Ir electrode cannot be used. Even if an Ir electrode were to be used, an oxidation of Ir occurs on the interface between the SBT and the Ir electrode, with the result that the interface characteristics are aggravated. Therefore, the IrO$_x$ electrode has to be used.

Further, even in the case of a stacked structure of SBT/IrO$_x$/TiN, an oxidation of the TiN layer occurs on the boundary between the iridium oxide layer and the TiN layer due to the presence of the iridium oxide layer.

In an attempt to solve this problem, if Ir is used under the iridium oxide layer, no oxidation occurs even at a 800° C./O$_2$-thermal process, because Ir is excellent in preventing the infiltration of oxygen.

That is, a stacking structure is used in the sequence of n-polysilicon/Ti-silicide/TiN/Ir/IrO$_x$).

However, if this stacking structure is used, there is formed a stacked structure of SBT/IrO$_x$/Ir/SiO$_2$ on the region outside the plug. That is, a weak interface is formed between the Ir/SiO$_2$ layers, with the result that a lifting phenomenon occurs.

Accordingly, additional adhesive layer should be formed at the interface of Ir/SiO$_2$ layers. But, in order to form the adhesive layers, an adhesive layer opening mask has to be used to open the plug region. Furthermore, the thickness of the lower electrode to be etched is increased as much as the thickness of the adhesive layer.

SUMMARY

The inventions described herein overcome the above-described limitations of known techniques.

The inventions herein provide methods of fabricating a high-density ferroelectric memory device in which the plug is prevented from being oxidized during a high temperature heat treatment.

In various of the inventions the fabricating methods include: forming an interlayer dielectric film on a semiconductor substrate after forming a transistor on the semiconductor substrate; selectively etching the interlayer dielectric film to form a contact hole; burying a plug and a barrier film into the contact hole; forming a conductive film on the interlayer dielectric film including the barrier film; selectively etching the conductive film to make both ends of the conductive film inclined so as to form a capping layer for capping the barrier film; and sequentially forming a lower electrode, a ferroelectric thin film and an upper electrode upon the interlayer dielectric film (which includes the capping layer).

Preferably, forming the capping layer includes: spreading photoresist on the conductive film to form a photoresist film; selectively patterning the photoresist film; making the patterned photoresist film flow; and etching the conductive film by using the patterned photoresist film as a mask.

Flowing the patterned photoresist film is carried out by a heat-treatment at a temperature of 100° C.~400° C. for 1 minute~one hour under an atmosphere of air, nitrogen, or argon.

Preferably, forming the capping layer includes: sequentially forming a hard mask and a photoresist film on the conductive film; selectively patterning the photoresist film; and etching the hard mask and the conductive film by using the patterned photoresist film as a mask.

The hard mask is made of any one selected from among TiN, TaN, SiOx and SiON, and is formed to a thickness of 50 Å~500 Å by employing a deposition process selected from among a physical vapor deposition process, a chemical vapor deposition process, and an atomic layer deposition process.

Preferably, the capping layer is made of Ir or Ru.

BRIEF DESCRIPTION OF THE DRAWINGS

The inventions will be described in detail with respect to specific exemplary embodiments with reference to the attached drawings in which.

DETAILED DESCRIPTION

A preferred exemplary embodiment of the present invention will be described in detail, so that those ordinarily skilled in the art can easily carry out the present invention.

Figure 1:
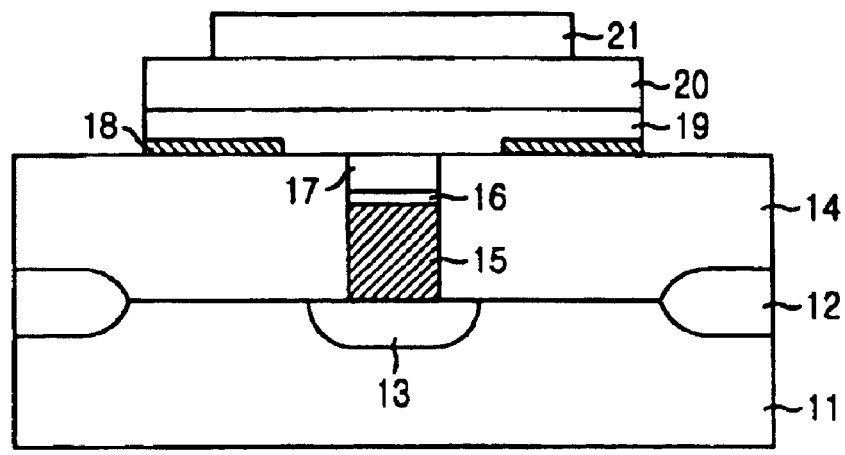
FIG. 1 (PRIOR ART) is a sectional view of a ferroelectric memory device that is fabricated by a conventional technique.
Figure 2:
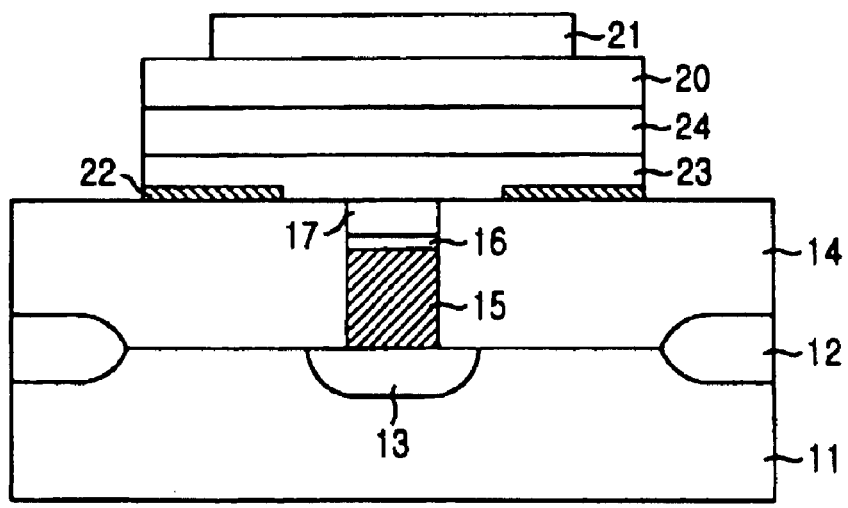
FIG. 2 (PRIOR ART) is a sectional view of a ferroelectric memory device which is fabricated by another conventional technique.
Figure 3A:
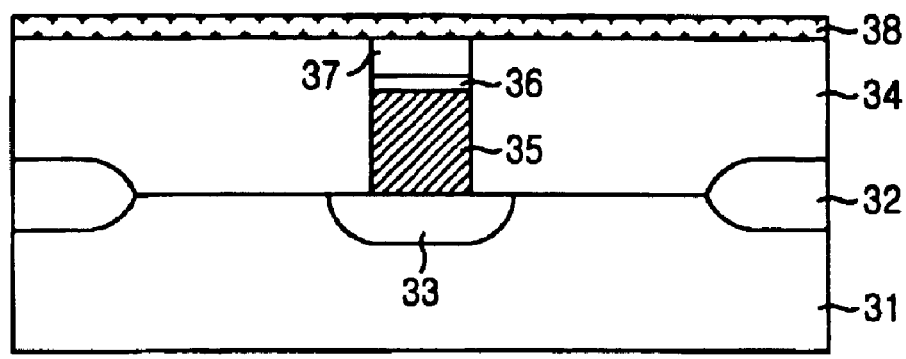
FIGS. 3a to 3c are sectional views showing the method for fabricating the ferroelectric memory device according to the inventions described and/or claimed herein.
Figure 3B:
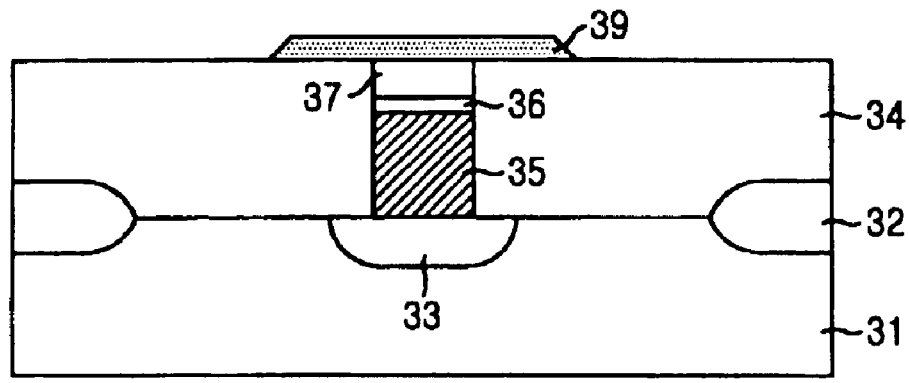
Figure 3C:
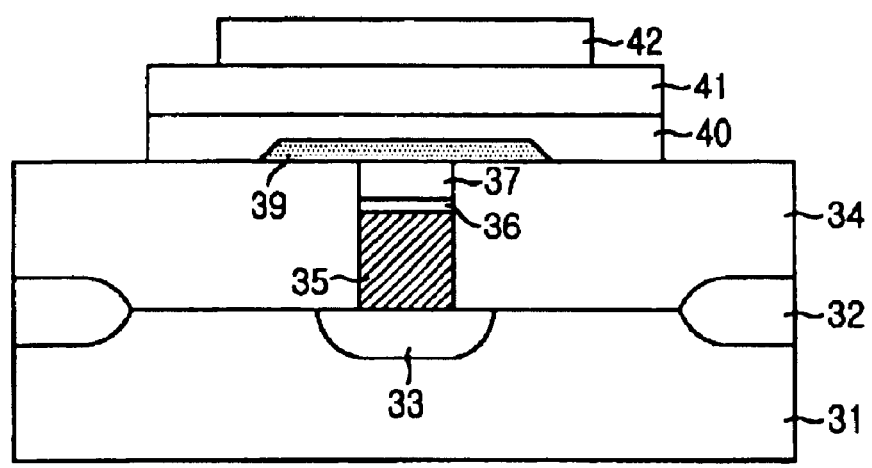

FIGS. 3a to 3c are sectional views showing a method for fabricating the ferroelectric memory device according to the inventions.

A field oxide layer 32 for device separations is formed on a semiconductor substrate 31. Then a dopant junction layer 33 for a transistor is formed on the semiconductor substrate 31 by carrying out an ion implantation process, and then, an interlayer dielectric film (ILD) 34 is formed on the semiconductor substrate 31.

Then photoresist is spread on the interlayer dielectric film to form a photoresist film (not illustrated), and then, a patterning is carried out by exposure and development. Then the interlayer dielectric film 34 is etched by using the patterned photoresist film as a mask, and thus, a contact hole is formed by which a part of a lower dopant junction layer 33 is exposed. Then the patterned photoresist film is removed.

Then a polysilicon in which phosphorus is doped (to be called "n-polysilicon" below) is formed on the entire surface including the contact hole, and then a recessing is carried out down to a certain depth by applying an etch-back process, thereby forming an n-polysilicon plug 35 to partly fill the contact hole.

Under this condition, the plug is made of any one selected from the group consisting of: arsenic(As)-doped polysilicon, tungsten (W), tungsten silicide (W-silicide), titanium silicide (Ti silicide), titanium nitride (TiN), tantalum silicide (Ta-silicide), and tantalum nitride (TaN).

Any one of the plug materials is deposited to a thickness of 100 Å~5000 Å by applying a chemical vapor deposition method (CVD) or an atomic layer deposition method (ALD).

For example, in the case where the n-polysilicon is used, an etch-back recessing is carried out down to a depth of 500

Å~5000 Å, and when carrying out the recessing, either a dry etch or a wet etch is adopted.

Then Ti is deposited on the entire surface, and then, a rapid thermal process (RPT) is carried out to induce reactions between Si atoms and Ti atoms, thereby forming a titanium silicide layer 36 on the n-polysilicon plug 35. Under this condition, the titanium silicide layer 36 forms an ohmic contact between the n-polysilicon plug 35 and a lower electrode (to be formed later).

The rapid thermal process is carried out at a temperature of 500° C.~800° C. for 10 seconds to 10 minutes under an atmosphere of $N_2$ or Ar.

Then a cleaning is carried out by employing the $H_2SO_4$+$H_2O_2$ chemical solution (to be called "SC-1" below), thereby removing the non-reacted titanium.

Meanwhile, the titanium silicide layer 36 that has been formed by the rapid thermal process has a C49 phase, but a second rapid thermal process can be carried out so that the titanium silicide layer 36 can be made to have a C54 phase. Under this condition, the second rapid thermal process is carried out at a temperature of 700° C.~1000° C. for 10 seconds to 10 minutes under an atmosphere of $N_2$ or Ar.

Then a titanium nitride layer 37 as a barrier metal is formed on the titanium silicide layer 36, and then, a chemical-mechanical polishing (CMP) or an etch-back is carried out on the titanium nitride layer 37 until the surface of the interlayer dielectric film 34 is exposed. Thus a barrier metal layer of a stacked structure is formed upon the n-polysilicon plug 35, and the stacked structure consists of Ti-silicide/TiN layers 36 and 37.

During a heat treatment at a later stage, the titanium nitride layer 37 serves to prevent the interdiffusion between the lower electrode and the polysilicon plug.

Under this condition, TiAlN, TaN or TaSiN as well as TiN can be used for the barrier metal layer. The barrier metal is deposited to a thickness of 50 Å~5000 Å by employing the chemical vapor deposition method (CVD) or the atomic layer deposition method (ALD).

Then an iridium layer 38 is formed by depositing Ir both on the interlayer dielectric film 34 and on the titanium nitride layer 37 as shown in FIG. 3a.

Then as shown in FIG. 3b, photoresist is spread on the Ir layer 38, and then a patterning is carried out by exposure and development. Then the Ir layer 38 is etched by using the patterned photoresist film so as to form an Ir capping layer 39. Under this condition, the etching is carried out in such a manner that the Ir capping layer 39 should remain only on the plug.

Under this condition, the Ir capping layer 39 has a width smaller than a lower electrode (to be formed later), but its width is large enough to cap the plug.

During the etching of the Ir layer 38, the Ir-capping layer 39 is made to remain on the stacked structure of the n-polysilicon plug/the titanium silicide layer/the titanium nitride layer 35/36/37. Further, in order to prevent a fence, the etching is carried out in such a manner that both ends of the Ir capping layer 39 should be inclined.

The etching of the Ir layer for preventing the formation of a fence is carried out in various manners.

First, the Ir etching process for preventing the fence is carried out in the following manner. That is, the patterned photoresist film is flowed by a heat treatment so as to form an inclined contour. Then the Ir layer is etched inclinedly by using the inclined photoresist film as a mask. Under this condition, the heat treatment for flowing the photoresist film is carried out at a temperature of 100° C.~400° C. for 1 minute to 1 hour under an atmosphere of air, $N_2$ or Ar.

Then during the Ir etching for preventing the fence, there is used a hard mask. The hard mask is made of any one selected from the group consisting of: TiN, TaN, $SiO_x$ and SiON. This hard mask is deposited to a thickness of 50 Å~599 Å by employing a physical vapor deposition process (PVD), a chemical vapor deposition process (CVD) or an atomic layer deposition process (ALD).

During the etching of the Ir layer 38, only the Ir capping layer 39 is made to remain as small as possible, so that an Ir lifting can be prevented. Further, a sufficient slope is provided, so that a fence would not be formed after the etching.

As described above, a interface (Ir/TiN interface) is formed between the Ir capping layer 39 and the titanium nitride layer 37. Therefore, there is no problem in the adherence.

Then as shown in FIG. 3c, after the formation of the Ir capping layer 39, an $IrO_x$ layer 40 as a lower electrode is deposited on the entire surface. Under this condition, the deposition of the Ir oxide layer 40 is carried out to a thickness of 100 Å~5000 Å by employing any one selected from among the physical vapor deposition method (PVD), the chemical vapor deposition method (CVD) and the atomic layer deposition method (ALD).

Thus the TiN layer 37, the Ir capping layer 39 and the Ir oxide layer 40 form a stacked structure, and therefore, the TiN layer 37 can be prevented from being oxidized by the Ir oxide layer 40. Further, a separate adhesive layer is not required, and Ir is used only on the plug region, with the result that the thickness of the lower electrode can be decreased.

Then a ferroelectric film (SBT) 41 is deposited on the Ir oxide layer 40, and is heat-treated. Under this condition, the deposition of the SBT film 41 is carried out to a thickness of 100 Å~5000 Å by applying a method selected from the group consisting of: a spin-on method, a chemical vapor deposition method (CVD) and an atomic layer deposition method. BLT, SBTN or PZT as well as SBT can be used for the ferroelectric film.

A heat treatment is carried out for the crystallization of the SBT film 41 by applying a rapid thermal process or a furnace process, or by simultaneously applying the rapid thermal process and the furnace process. Under this condition, the heat treatment is carried out at a temperature of 500° C.~800° C. for 1 minute to 2 hours under an atmosphere of air, $N_2$ or Ar.

Then a platinum (Pt) layer 42 is deposited on the SBT film 41, and an etching is carried out on the Pt layer 42, on the SBT film 41 and on the Ir oxide film 40 in a sequential manner, thereby completing the capacitor of the present invention.

Meanwhile, in patterning the capacitor, a 2-stage etching process may be carried out by etching the Pt layer 42 first, and by simultaneously etching the SBT film 41 and the Ir oxide film 40. Or a single stage process may be carried out by etching the Pt layer 42, the SBT film 41 and the Ir oxide film 40 simultaneously.

Thereafter, the general FeRAM device fabricating process is carried out so as to form a high density FeRAM device of a polysilicon-plugged structure.

In another exemplary embodiment of the present invention, a ruthenium oxide ($RuO_x$) as the lower electrode is used instead of the Ir oxide layer. Further, in capping the lower plug structure, Ru may be used instead of Ir. In these cases also, the same effects can be reaped.

That is, $RuO_x/Ir$, $IrO_x/Ru$ or $RuO_x/Ru$ may be adopted instead of $IrO_x/Ir$.

The present inventions were described based on the specific preferred embodiments and the attached drawings. But it should be apparent to those ordinarily skilled in the art that various changes and modifications can be added without departing from the spirit and scope of the present invention that will be defined in the appended claims.

According to the inventions presented herein a, a capping layer is formed, and therefore, during a high temperature heat treatment, the plug can be prevented from being oxidized. Further, a high temperature heat treatment can be carried out for the ferroelectric film.

Further, an Ir conductive layer or the like is used on the plug for capping it, and therefore, a separate adhesive layer is not required. Further, the deposition thickness of the lower electrode is decreased, and therefore, the etching process becomes advantageous, with the result that the manufacture of a high-density device is rendered easier.

What is claimed is:

1. A method for fabricating a high density ferroelectric memory device, comprising:
    forming an interlayer dielectric film on a semiconductor substrate after forming a transistor on the semiconductor substrate;
    selectively etching the interlayer dielectric film to form a contact hole;
    burying a plug and a barrier film into the contact hole;
    forming a conductive film on the interlayer dielectric film including the barrier film, wherein the conductive film is formed by using iridium or ruthenium;
    selectively etching the conductive film to make both ends of the conductive film inclined so as to form a capping layer for capping the barrier film;
    forming a lower electrode on the interlayer dielectric film including the capping layer, the lower electrode comprising a material different from the capping layer;
    forming a ferroelectric thin film on the lower electrode; and
    forming an upper electrode on the ferroelectric thin film.

2. The method of claim 1, wherein forming the capping layer comprises:
    spreading photoresist on the conductive film to form a photoresist film;
    selectively patterning the photoresist film;
    flowing the photoresist film thus patterned; and
    etching the conductive film by using the photoresist film thus flowed as a mask.

3. The method of claim 2, wherein flowing the patterned photoresist film is carried out by a heat treatment at a temperature of 100° C.~400° C. for 1 minute to 1 hour under an atmosphere of air, nitrogen or argon.

4. The method of claim 1, wherein forming the capping layer comprises:
    forming a hard mask and a photoresist film on the conductive layer in a sequential manner;
    selectively patterning the photoresist film; and
    etching the hard mask by using the patterned photoresist film as a mask and etching the conductive film by using the patterned hard mask film as a mask.

5. The method of claim 4, wherein the hard mask is formed by using any one selected from among TiN, TaN, $SiO_2$ and SiON, and is deposited to a thickness of 50 Å~500 Å by employing any one selected from among a physical vapor deposition method, a chemical vapor deposition method and an atomic layer deposition method.

6. The method of claim 1, wherein the lower electrode is an iridium oxide film or a ruthenium oxide film, and is deposited to a thickness of 100 Å~5000 Å by employing any one selected from among a physical vapor deposition method, a chemical vapor deposition method and an atomic layer deposition method.

7. The method of claim 1, wherein the ferroelectric thin film is formed by using any one selected from among SBT, BLT, SBTN and PZT, and is deposited to a thickness of 100 Å~5000 Å by employing any one selected from among a spin-on method, a chemical vapor deposition method and an atomic layer deposition method.

8. The method of claim 1, wherein after forming the ferroelectric thin film, a rapid thermal process or a furnace process is carried out, or the rapid thermal process and the furnace process are simultaneously carried out, at a temperature of 500° C.~800° C. for 1 minute to 2 hours under an atmosphere of oxygen, air, nitrogen or argon.

9. The method of claim 1, wherein burying the plug and the barrier film comprises:
    forming a conductive film for the plug on the interlayer dielectric film including the contact hole;
    carrying out an etch-back on the conductive film to partly fill the contact hole; depositing titanium to form a titanium layer on an entire surface including the plug; heat-treating the titanium layer to form a titanium silicide layer only on the plug; and forming a barrier film on the titanium silicide layer.

10. The method of claim 9, wherein the conductive film for the plug is formed by using any one selected from among phosphorus-doped polysilicon, arsenic-doped polysilicon, tungsten, tungsten silicide, titanium silicide, titanium nitride, tantalum silicide and tantalum nitride; and the conductive film is deposited to a thickness of 100 Å~5000 Å by employing any one of a chemical vapor deposition method and an atomic layer deposition method.

11. The method of any one of claims 9 and 10, wherein if polysilicon is used for the conductive layer, the conductive layer is recessed down to a depth of 500 Å~5000 Å, by carrying out a dry or wet etch-back process.

12. The method of claim 9, wherein a titanium heat treatment is carried out at a temperature of 500° C.~800° C. for 10 seconds to 10 minutes under an atmosphere of nitrogen or argon.

13. The method of claim 9, further comprising after heat-treating the titanium:
    carrying out a wet cleaning process to remove non-reacted titanium atoms by employing the $H_2SO_4+H_2O_2$ chemical solution; and
    heat-treating at a temperature of 700° C.~1000° C. for 10 seconds to 10 minutes under an atmosphere of nitrogen or argon.

14. The method of claim 9, wherein the barrier film is formed by using any one selected from among TiN, TiAlN, TaN and TaSiN, and is deposited to a thickness of 500 Å~5000 Å by carrying out a chemical vapor deposition method or an atomic layer deposition method.

* * * * *